United States Patent
Frencken et al.

(10) Patent No.: US 11,860,554 B2
(45) Date of Patent: Jan. 2, 2024

(54) OBJECT POSITIONER, METHOD FOR CORRECTING THE SHAPE OF AN OBJECT, LITHOGRAPHIC APPARATUS, OBJECT INSPECTION APPARATUS, DEVICE MANUFACTURING METHOD

(71) Applicant: ASML NETHERLANDS B.V., Veldhoven (NL)

(72) Inventors: Mark Johannes Hermanus Frencken, Ittervoort (NL); Theodorus Marcus Nagtegaal, Eindhoven (NL); Oleg Viacheslavovich Voznyi, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 129 days.

(21) Appl. No.: 17/606,785

(22) PCT Filed: Mar. 27, 2020

(86) PCT No.: PCT/EP2020/058871
§ 371 (c)(1),
(2) Date: Oct. 27, 2021

(87) PCT Pub. No.: WO2020/221529
PCT Pub. Date: Nov. 5, 2020

(65) Prior Publication Data
US 2022/0214626 A1    Jul. 7, 2022

(30) Foreign Application Priority Data
May 1, 2019    (EP) .................................... 19172109

(51) Int. Cl.
*G03F 7/00*    (2006.01)

(52) U.S. Cl.
CPC ........ *G03F 7/70783* (2013.01); *G03F 7/7075* (2013.01); *G03F 7/70875* (2013.01)

(58) Field of Classification Search
CPC . G03F 7/70783; G03F 7/7075; G03F 7/70875
See application file for complete search history.

(56) References Cited

U.S. PATENT DOCUMENTS

| 6,020,964 A | 2/2000 | Loopstra et al. |
| 6,347,535 B2 * | 2/2002 | Kamata .................. C03B 29/025 |
| | | 219/448.11 |

(Continued)

FOREIGN PATENT DOCUMENTS

| JP | 2006-228820 | 8/2006 |
| JP | 2010-283305 | 12/2010 |
| WO | 2014/048651 | 4/2014 |

OTHER PUBLICATIONS

International Search Report dated Jun. 26, 2020, issued in corresponding International Patent Application No. PCT/EP2020/058871.

(Continued)

*Primary Examiner* — Hung V Nguyen
(74) *Attorney, Agent, or Firm* — Pillsbury Winthrop Shaw Pittman, LLP

(57) ABSTRACT

The invention provides an object positioner comprising:— an object support having an object support surface which is configured to engage at least a part of an object, said object support surface having a support surface temperature,—a thermal device, which thermal device is configured to provide at least a part of the object with a first object temperature, which first object temperature differs from the support surface temperature by a first predetermined temperature difference.

20 Claims, 6 Drawing Sheets

(56) References Cited

U.S. PATENT DOCUMENTS

| | | | |
|---|---|---|---|
| 6,440,619 B1 | 8/2002 | Feldman | |
| 6,952,253 B2 | 10/2005 | Lof et al. | |
| 9,684,251 B2 * | 6/2017 | Holzmann | G03F 7/70808 |
| 11,175,598 B2 * | 11/2021 | Sato | G03F 9/7042 |
| 2007/0058173 A1 | 3/2007 | Holzapfel | |
| 2007/0273851 A1 | 11/2007 | Finders et al. | |
| 2015/0108674 A1 * | 4/2015 | Murakami | B29C 43/021 |
| | | | 425/150 |
| 2017/0285331 A1 | 10/2017 | Miyaharu et al. | |
| 2018/0076098 A1 | 3/2018 | Kim | |
| 2018/0321602 A1 | 11/2018 | Lafarre et al. | |

OTHER PUBLICATIONS

Written Opinion of the International Searching Authority dated Jun. 26, 2020, issued in corresponding International Patent Application No. PCT/EP2020/058871.

H. Aoyama et al., "Magnification correction by changing wafer temperature in proximity x-ray lithography", J. Vac. Sci. Technol. B 17(6), 3411-3414 (1999).

* cited by examiner

OBJECT POSITIONER, METHOD FOR CORRECTING THE SHAPE OF AN OBJECT, LITHOGRAPHIC APPARATUS, OBJECT INSPECTION APPARATUS, DEVICE MANUFACTURING METHOD

CROSS-REFERENCE TO RELATED APPLICATION

The application is the U.S. national phase entry of PCT Patent Application No. PCT/EP2020/058871 which was filed on Mar. 27, 2020, which is based upon and claims the benefit of priority of European Patent Application No. 19172109.1 which was filed on May 1, 2019, each of which is incorporated herein in its entirety by reference.

FIELD present invention relates to an object positioner, a method for correcting the shape of an object, a lithographic apparatus, an object inspection apparatus, and a device manufacturing method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). An object inspection apparatus is for example suitable for inspecting a pattern which has been applied to an object e.g. to a substrate, e.g. to a wafer.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In lithographic processes, it is of the utmost importance that the pattern that is projected on the substrate is highly accurate. The flatness on the object onto which the pattern is projected (e.g. the substrate, e.g. the wafer), is an important factor in obtaining the desired accuracy of the projected pattern. However, for example due to the processing of the substrates, in particular the repeated application, curing and etching of the resist layer, the shape of the substrate may deviate from the desired entirely flat shape due to deformations of the substrate in the direction perpendicular to the plane of the substrate. The substrate may for example be warped, or have an umbrella-shape or a bowl-shape, or maybe even have a higher order deviation from the flat shape.

In addition, also deformations, e.g. local deformations, in the plane of the substrate should be kept to a minimum, in order to reduce overlay errors as much as possible.

Several solutions for flattening substrates have been proposed. For example, in some known lithographic systems, the substrate is clamped onto an object support (e.g. a substrate support, e.g. a wafer table) with a locally varying clamping force which allows to flatten the substrate to at least some extent. However, such solutions require modifications to the object support, which can be hard to implement. In addition, problems with deformation of the substrate in the plane of the substrate are not solved, and may even be enhanced by the deformation of the substrate in the direction perpendicular to the plane of the substrate.

SUMMARY

The invention aims to provide an object positioner which helps to reduce deformation of a substrate and a method for correcting the shape of an object.

According to an embodiment of the invention, an object positioner is provided which comprises:

an object support having an object support surface which is configured to engage at least a part of an object, said object support surface having a support surface temperature, a thermal device, which thermal device is configured to provide at least a part of the object with a first object temperature, which first object temperature differs from the support surface temperature by a first predetermined temperature difference.

In accordance with the current invention, an object support is provided which has an object support surface which is configured to engage at least a part of an object. The object support is for example a substrate support or a wafer table of a wafer stage. The object support surface is for example the support surface of a substrate support, e.g. a wafer table, onto which the object is supported during exposure or during measurement. The object support surface has a support surface temperature.

Furthermore, a thermal device is provided which is configured to bring at least a part of the object, for example a substrate, for example a wafer, to a first object temperature. The first object temperature is different from the support surface temperature of the object support surface on which that object is or will be supported.

It is known to control the temperature of the object in order to bring this temperature at the same temperature as the object support surface has, and with a uniform temperature distribution over the object in order to prevent thermal deformation of the object. The invention goes against this known idea by deliberately providing the object with a first object temperature which is different from the support surface temperature. By doing so, the object will deform due to thermal expansion and/or thermal shrink, in a uniform way or in a non-uniform way depending on the temperature profile which is provided to the object by the thermal device. This allows to control the shape of the object and therewith to counteract existing undesired deformation of the object due to other causes, e.g. the processing of the object outside of the lithographic apparatus, such as the repeated applying, curing and/or etching of resist layers on the object, e.g. the substrate. The first object temperature is for example a temperature of the outer surface of the object.

The thermal device may comprise a heater and/or a cooler. The first object temperature may be above or below the support surface temperature. For example, the thermal device may comprise one or more thermal elements, which are for example heating elements (e.g. infrared LED's) and/or cooling elements (e.g. Peltier elements). The thermal device optionally comprises heating elements as well as cooling elements. These thermal elements may for example be arranged in a grid-like layout (e.g. in a two dimensional Carthesian grid or in a polar grid) or in an array (e.g. in a linear arrangement). During heating and/or cooling of the object, the thermal elements may be stationary relative to the object, or the thermal elements may be moved relative to the object, e.g. in a scanning motion of the thermal elements relative the object.

In accordance with the invention, for example the entire object is provided with the first object temperature. In this case, the object obtains a uniform temperature. Alternatively, the object may be provided locally with the first object temperature. In that case, the object obtains a non-uniform temperature.

In an embodiment of the object positioner according to the invention, the thermal device is configured to provide a first portion of the object with the first object temperature and a second portion of the object with a second object temperature, which second object temperature differs from the support surface temperature by a second predetermined temperature difference.

The second temperature difference may be the same as the first temperature difference, or the second temperature difference may be different from the first temperature difference. The first object temperature may be the same as the second object temperature, or first object temperature may be different from the second object temperature. The second object temperature is for example a temperature of the outer surface of the object.

In this embodiment, the object obtains a non-uniform temperature profile due to the action of the thermal device. This allows to locally correct the shape of the object. This is for example advantageous if the object has a local undesired deformation, e.g. a local bulge or a deformed circumferential edge.

If in this embodiment the first object temperature is the same as the second object temperature, and/or the second temperature difference is the same as the first temperature difference, the portion or portions of the object between the first portion and the second portion optionally have a temperature which is different from the first object temperature and from the second object temperature. For example, the portion or portions of the object between the first portion and the second portion may have or be provided with a temperature which is the same as the support surface temperature.

In an embodiment of the object positioner according to the invention, the thermal device is configured to provide at least a part of the object with a temperature gradient between a first maximum temperature and a first minimum temperature. The first object temperature is the first maximum temperature, the first minimum temperature or a temperature between the first maximum temperature and the first minimum temperature.

Depending on the shape of the object, in particular on the existing undesired deformation of the object, a shape which better approaches the desired shape of the object can be obtained by providing the object with a temperature gradient.

In an embodiment of the object positioner according to the invention, the object positioner further comprises an object infeed device which is configured to supply the object to the object support.

In this embodiment, the thermal device is arranged relative to the object infeed device such that the object is provided with the first object temperature before the object is arranged on the object support.

This way, the thermal device can be arranged at a position away from the object support. Building space is often very scarce at or close to the object support, so this embodiment provides layout which is often more practical.

In this embodiment, any expected heating or cooling of the object during further transport to the object support is optionally taken into account when the first and/or second object temperature is determined.

Optionally, in this embodiment at least a part of the object infeed device and at least a part of the thermal device are moveable relative to each other. For example, at least a part of the object infeed device is moveable, for example moveable along a path, in order to transport the object to the object support. At least a part of the thermal device, for example one or more thermal elements such as heating elements and/or cooling elements, may for example be arranged along this track, so the object on the object infeed device is provided with the first object temperature upon passing the thermal elements of the thermal device. Alternatively or in addition, the object infeed device may be stationary when the thermal device provides the object with the first object temperature, e.g. by moving one or more thermal elements over the object while the object infeed device is stationary. Alternatively, both at least a part of the object infeed device and a part of the thermal device (e.g. one or more heating elements and/or cooling elements) both move, e.g. in opposite directions, so that a relative movement of the at least part of the object infeed device and the at least part of the thermal device is obtained.

For example, the thermal device may comprise one or more thermal elements, including heating elements (e.g. infrared LED's) and/or cooling elements (e.g. Peltier elements). These thermal elements may for example be arranged in a grid-like layout (e.g. in a two dimensional Carthesian grid or in a polar grid) or in an array (e.g. in a linear arrangement). During heating and/or cooling of the object, the thermal elements may be stationary relative to the object, or the thermal elements may be moved relative to the object, e.g. in a scanning motion of the heating elements and/or cooling elements relative the object.

Optionally, in an variant of this embodiment, at least a part of the thermal device is mounted in the object infeed device, for example in or below an infeed device support surface, which is configured to support the object during the transport thereof to the object support. Optionally, the thermal device comprises multiple thermal elements, which are arranged in or below the infeed device support surface.

In an embodiment of the object positioner according to the invention, at least a part of the thermal device and at least a part of the object support are moveable relative to each other.

For example, the thermal device comprises one or more heating elements and one or more cooling elements, and the object support is moveable relative to these heating elements and/or cooling elements. The object support may be stationary and the heating elements and/or cooling elements are moveable, or the object support may be moveable and the heating elements and/or cooling elements are stationary, or both the object support and the heating elements and/or cooling elements are moveable.

In an embodiment of the object positioner according to the invention, the thermal device is mounted in the object support, adjacent to the object support surface.

In this embodiment, for example the object support surface comprises one or more notches or recesses, in which a heating element and/or cooling element of the thermal device is arranged. Alternatively or in addition, one or more heating elements and/or cooling elements of the thermal device are for example arranged below the object support surface, e.g. in a grid-like arrangement. Alternatively or in addition, the object support may comprise a plurality of burls which together form the object support surface, and wherein one or more thermal elements of the thermal device are arranged between the burls. Preferably, between the heating elements and/or cooling elements of the thermal device, the object support surface has a temperature equal to the support surface temperature.

In an embodiment of the object positioner according to the invention, the thermal device comprises a heating element which is for example an infrared LED and/or cooling element which is for example a Peltier element.

In an embodiment of the object positioner according to the invention the object positioner further comprises a measurement tool which is configured to generate shape data of an object.

The measurement tool generates shape data which can be used to determine (e.g. calculate) the first object temperature that the thermal device has to provide in order to correct the actual shape of the object.

Optionally, also a desired temperature profile (either uniform or non-uniform) and/or a second object temperature for the object is determined.

In an embodiment of the object positioner according to the invention, the object positioner further comprises a control device, which control device is configured to receive shape data relating to the shape of the object, and to generate a control signal based on the shape data. In this embodiment, the thermal device is at least partly controlled on the basis of said control signal.

In this embodiment of the object positioner, a control device is provided which receives data relating to the shape of the object. This shape data can for example be obtained by measuring or calculating the actual shape of the object. This way, the deviation of the actual shape from the desired shape of the object is known. This information is then used to the generate a control signal, on the basis of which the thermal device is controlled.

Based on the shape data, it is determined (e.g. calculated) what the first object temperature should be. Then, a control signal is generated and sent to the thermal device (e.g. through a wired data connection or a wireless data connection), and the thermal device is activated to provide the object with the first object temperature.

Optionally, also a desired temperature profile (either uniform or non-uniform) for the object and/or a second object temperature is determined, and a corresponding control signal for the thermal device is created by the control device.

Optionally, in this embodiment, the object positioner further comprises a measurement tool which is configured to generate shape data of an object, and the control device is configured to generate a control signal based on the shape data which is generated by the measurement tool.

In an embodiment of the object positioner according to the invention, the object support surface is configured to engage at least a part of an object which object is a substrate, e.g. a wafer.

According to an embodiment of the invention, a method for correcting the shape of an object is provided, which method comprises the following steps:
    determining the shape of said object,
    comparing the determined shape of said object with a desired shape of said object, and therewith determining a difference between the desired shape and the determined shape,
    determining a temperature profile for the object which provides the object with a deformed shape, wherein the difference between the deformed shape and the determined shape is smaller than the difference between the desired shape and the determined shape for at least a part of the object,
    applying the temperature profile to the object.

The temperature profile can be a uniform temperature profile, with the object obtaining a uniform temperature over its surface. Alternatively, the temperature profile can be a non-uniform temperature profile, with the object obtaining a non-uniform temperature over its surface, so a first portion of the surface of the object has a different temperature than a second portion of the surface of the object.

In an embodiment of the method according to the invention, the method further comprises the step of clamping the object onto an object support having an object support surface which is configured to engage at least a part of an object during positioning of said object. In this embodiment the temperature profile is applied either before or during the clamping of the object onto the object support.

For example, the object support is a substrate support, e.g. a wafer table, for example in a lithographic apparatus or object inspection apparatus. In a lithographic apparatus or object inspection apparatus, the object (e.g. a substrate, e.g. a wafer) is clamped onto the object support surface of the object support during the positioning of the object, e.g. relative to a projection beam and/or a measurement beam. In accordance with this embodiment of the method according to the invention, the temperature profile is applied to the object (e.g. the substrate, e.g. the wafer) either before or during the clamping of the object on the object support surface is effected. In general, the temperature profile is applied before the exposure of the object to the projection beam or measurement beam starts.

Optionally, in this embodiment, the object support surface has a support surface temperature, and the temperature profile which is applied to the object is a uniform temperature profile at a first object temperature, which first object temperature differs from the support surface temperature by a first predetermined temperature difference.

Optionally, in this embodiment the object support surface has a support surface temperature, and the temperature profile which is applied to the object is a non-uniform temperature profile comprising a first object temperature, which first object temperature differs from the support surface temperature by a first predetermined temperature difference.

In an embodiment of the method according to the invention, the object is a substrate, e.g. a wafer.

According to an embodiment of the invention, lithographic system is provided which comprises an object positioner according to the invention.

In an embodiment of the lithographic apparatus according to the invention, the lithographic apparatus further comprises a projection system, and the object support is configured for positioning an object relative to the projection system.

According to an embodiment of the invention, a lithographic system is provided which comprises:
    an illumination system configured to condition a radiation beam;
    a support constructed to support a patterning device, the patterning device being capable of imparting the radiation beam with a pattern in its cross-section to form a patterned radiation beam;
    a projection system configured to project a patterned radiation beam onto a substrate; the projection system comprising a plurality of optical elements, a wafer stage having an substrate support surface which is configured to engage at least a part of the substrate, said substrate support surface having a support surface temperature, a thermal device, which thermal device is configured to provide at least a part of the substrate with a first object temperature, which first object temperature differs from the support surface temperature by a first predetermined temperature difference.

Optionally, in this embodiment, the lithographic apparatus further comprises a thermal stabilization device, and at least a part of the thermal device is arranged in the thermal stabilization device. For example, one or more thermal elements of the thermal device are arranged in the thermal stabilization device.

Optionally, in this embodiment, the lithographic apparatus further comprises a thermal stabilization device and a substrate transport device which is configured to transport a substrate from the thermal stabilization device towards the wafer stage along a substrate infeed path. At least a part of the thermal device is arranged along the substrate infeed path. For example, one or more thermal elements of the thermal device are arranged along a substrate infeed path.

In a further embodiment of the invention, an object inspection apparatus is provided which comprises an object positioner according to the invention.

According to an embodiment of the invention, a device manufacturing method is provided which comprises transferring a pattern from a patterning device onto a substrate, comprising the step of using a lithographic apparatus according to the invention.

According to an embodiment of the invention, a device manufacturing method is provided which comprises the following steps:

determining the shape of a substrate, comparing the determined shape of said substrate with a desired shape of said substrate, and therewith determining a difference between the desired shape and the determined shape, determining a temperature profile for the substrate which provides the substrate with a deformed shape, wherein the difference between the deformed shape and the determined shape is smaller than the difference between the desired shape and the determined shape for at least a part of the substrate, applying the temperature profile to the substrate, after applying the temperature profile to the substrate, transferring a pattern from a patterning device onto the substrate.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
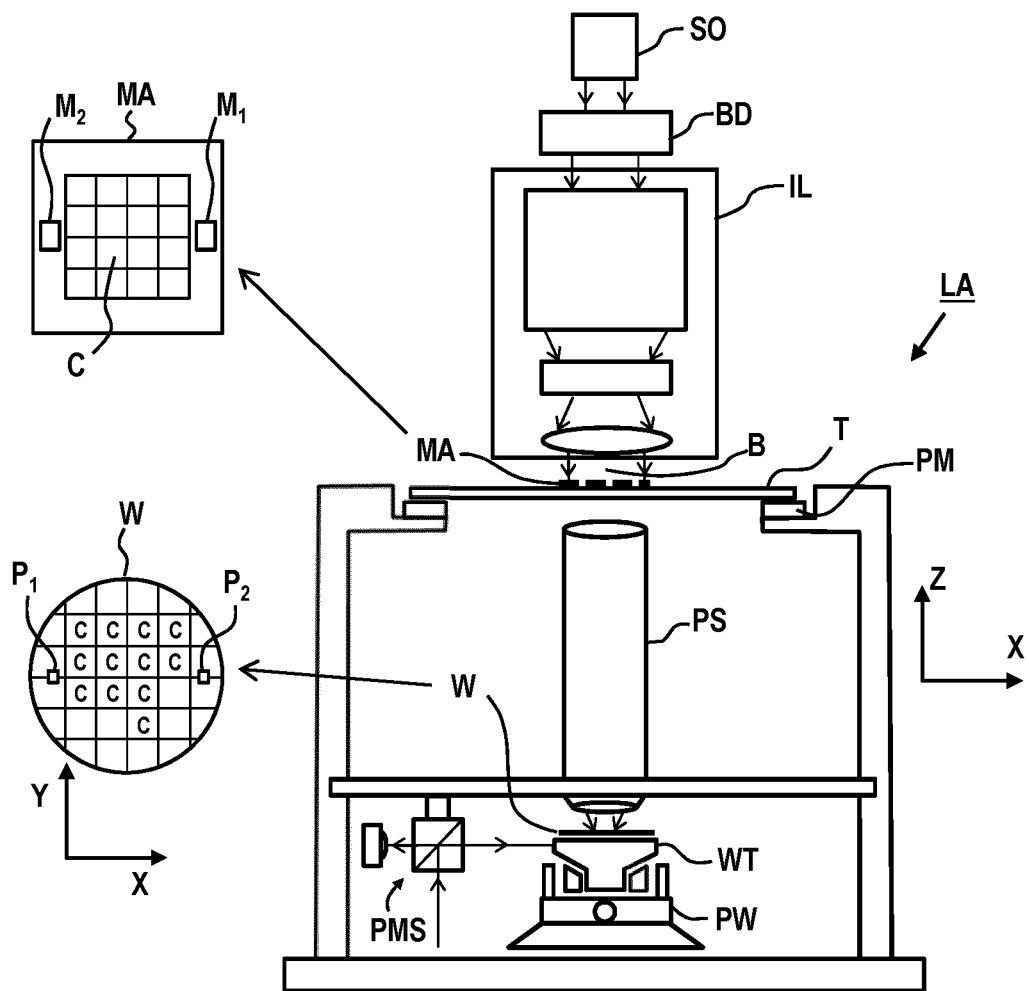
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
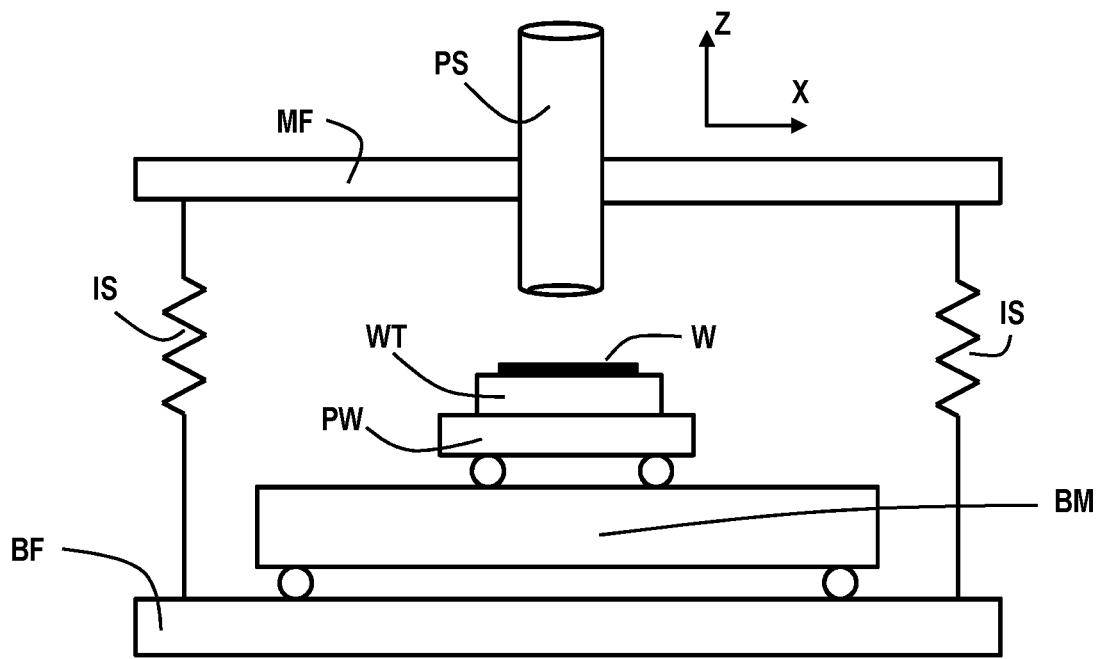
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction.

Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference.

The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
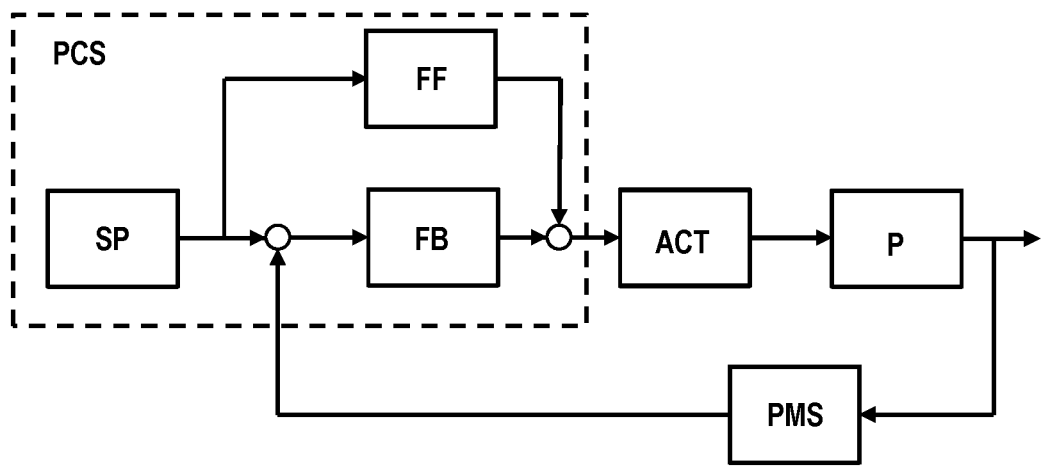
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4A:
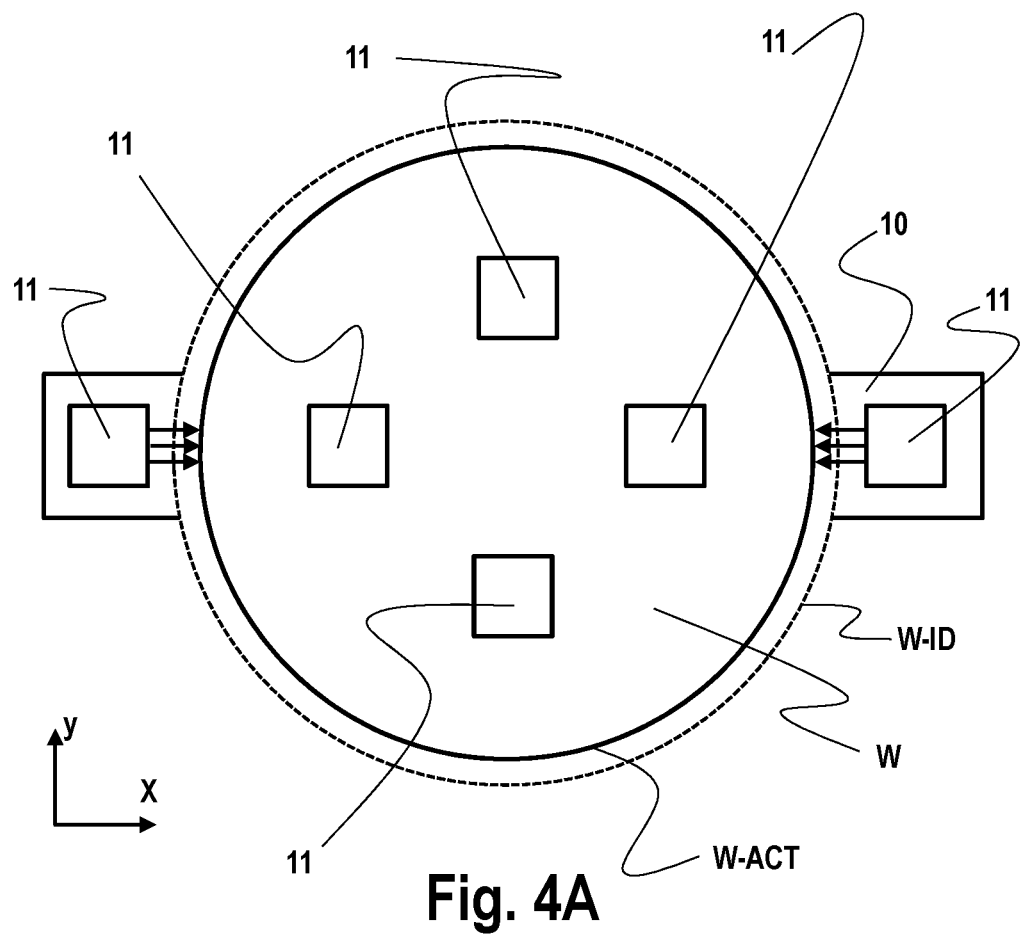
FIG. 4A schematically shows, in top view, an object which has an actual shape that deviates from the ideal shape.
Figure 4B:
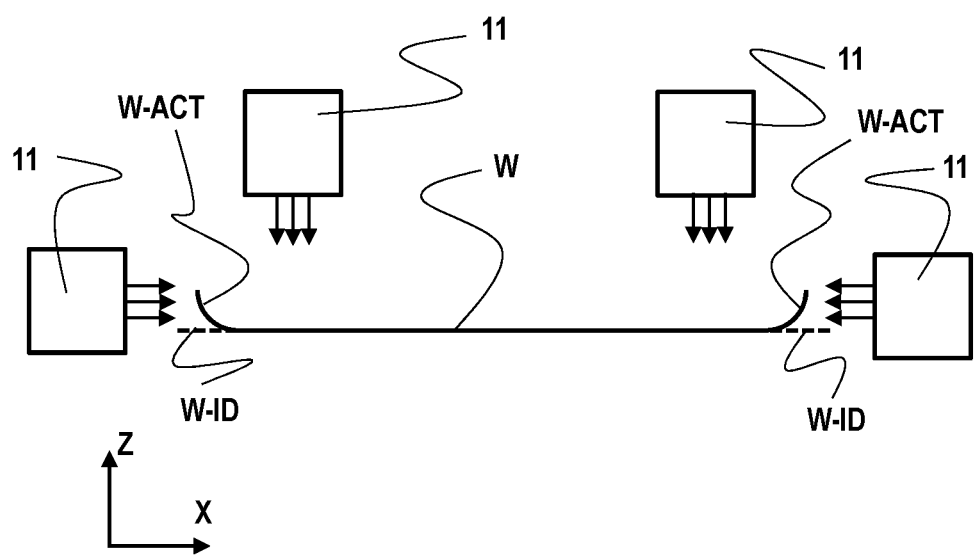
FIG. 4B shows the object of FIG. 4A in side view, FIG. 5 schematically shows a first embodiment of a system according to the invention FIG. 6 schematically shows a further embodiment a system according to the invention, FIG. 7 schematically shows an example of an object with a non-uniform temperature distribution as can be applied by a thermal device.

FIG. 4A schematically shows, in top view, an object W which has an actual shape that deviates from the ideal shape. In the example of FIG. 4A, the ideal shape for the object W, which is for example a substrate, for example a wafer, is a flat disk-shape. In the actual shape, the edge of the object W is curled upwards, so the actual shape of the object W is more like a bowl-shape. FIG. 4B shows this same object W in side view.

In FIGS. 4A and 4B, the dashed line W-ID indicates the ideal or desired contour of the object W, and the solid line W-ACT indicates the actual contour of the object W.

By either changing the temperature of the object W, its shape and/or size will be changed due to thermal expansion or thermal shrink. This allows to correct the shape of the object W, and therewith to bring it into a shape which approaches the desired or ideal shape more closely. Depending on the desired shape change, the temperature of the object W can be changed locally, or the overall temperature of the object can be changed.

For example, in the situation of the bowl shape as shown in FIGS. 4A and 4B, when the outer circumference of the object W is brought to a higher temperature than the center of the object W has, the outer circumference of the object W will expand, which will result in a flattening of the bowl shape. FIG. 4A schematically shows a thermal device 10, which comprises several thermal elements 11. The thermal elements 11 can be heaters and/or coolers. They are preferably arranged in the vicinity of the object W, e.g. in a plane parallel to the plane of the object W. The thermal elements 11 can be arranged either stationary or movable relative to the object W. The thermal elements 11 can be used to obtain a temperature profile (i.e. a temperature distribution) in the object W which results in an actual shape which better approached the ideal or desired shape.

Figure 5:
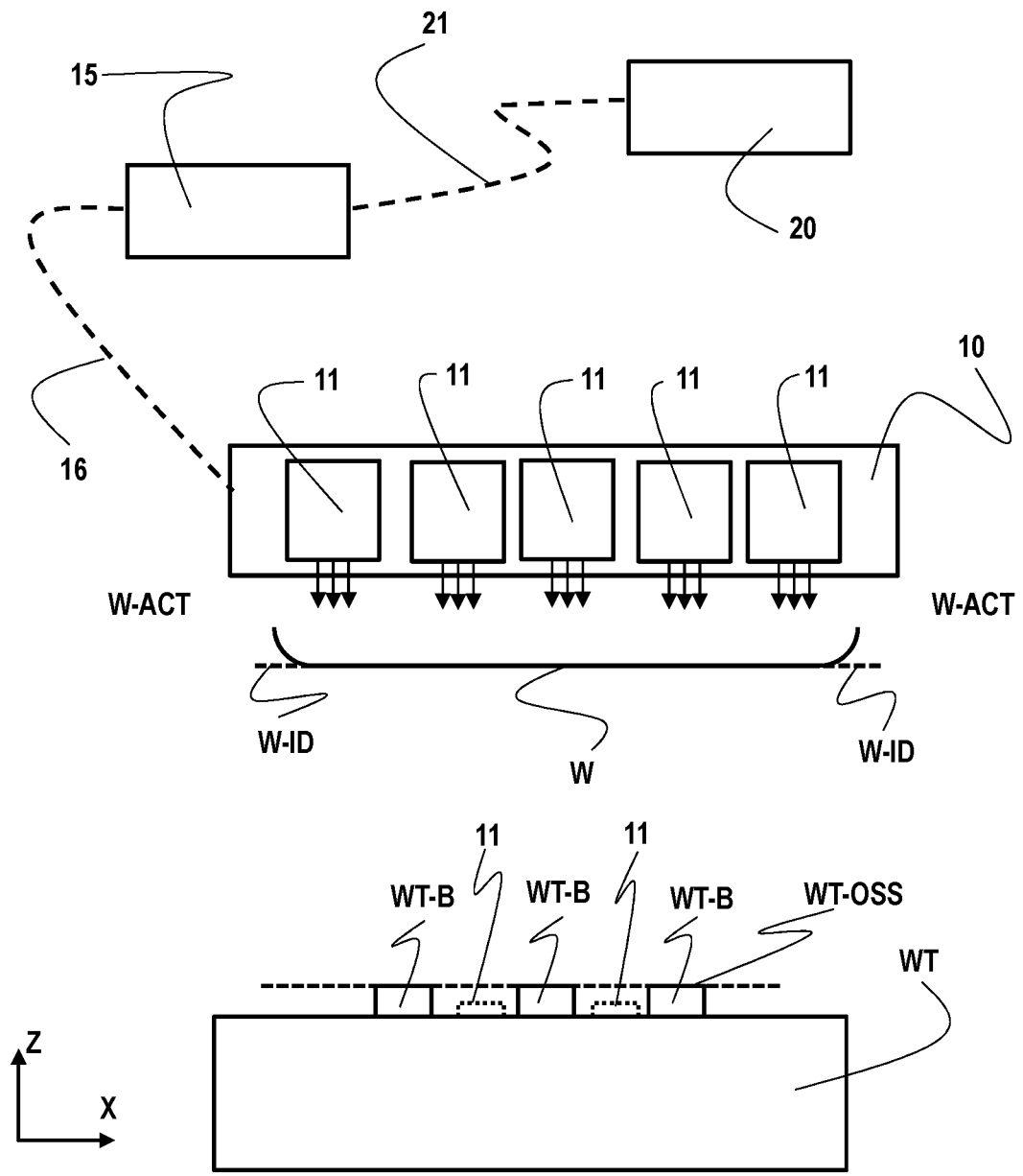

FIG. 5 schematically shows a first embodiment of an object positioner according to the invention.

In the embodiment of FIG. 5, the object positioner comprises an object support WT having an object support surface WT-OSS which is configured to engage at least a part of an object W. The object support surface WT-OSS has a support surface temperature.

The object W is for example a substrate, for example a wafer. The object support WT is for example a substrate support, wafer stage or wafer table. If the object positioner according to FIG. 5 is part of a lithographic apparatus, object support surface WT-OSS engages and/or supports the object W during exposure to the projection beam. If the object positioner according to FIG. 5 is part of an object inspection apparatus, object support surface WT-OSS engages and/or supports the object W during exposure to the measurement beam.

In the example of FIG. 5, the object support WT is provided with a plurality of burls WT-B, which have a fee surface which in use engages the object W. These free surfaces of the burls WT-B together form the object support surface WT-B.

The object positioner of FIG. 5 further comprises a thermal device 10. The thermal device 10 is configured to provide at least a part of the object W with a first object temperature. The first object temperature differs from the support surface temperature by a first predetermined temperature difference. This allows to correct the actual shape of the object W, i.e. to bring the actual shape of the object W closer to the desired or ideal shape of the object W. The first object temperature may be above or below the support surface temperature.

By providing at least a part of the object W with a first object temperature which is different from the support surface temperature, the object W will deform due to thermal expansion and/or thermal shrink, in a uniform way or in a non-uniform way depending on the temperature profile which is provided to the object W by the thermal device 10. This allows to control the shape of the object and therewith to counteract existing undesired deformation of the object W due to other causes, e.g. the processing of the object W such as the repeated applying, curing and/or etching of resist layers on the object W. The first object temperature is for example a temperature of the outer surface of the object W.

In the embodiment of FIG. 5, for example the entire object W is provided with the first object temperature. In this case, the object W obtains a uniform temperature. Alternatively, the object W may be provided locally with the first object temperature. In that case, the object W obtains a non-uniform temperature.

In the embodiment of FIG. 5, for example the thermal device 10 is configured to provide a first portion of the object W with the first object temperature and a second portion of the object W with a second object temperature. The second object temperature differs from the support surface temperature by a second predetermined temperature difference. The second temperature difference may be the same as the first temperature difference, or the second temperature difference may be different from the first temperature difference. The first object temperature may be the same as the second object temperature, or first object temperature may be different from the second object temperature. The second object temperature is for example a temperature of the outer surface of the object W.

In this embodiment, the object W obtains a non-uniform temperature profile due to the action of the thermal device 10. This allows to locally correct the shape of the object.

The portion or portions of the object W between the first portion and the second portion optionally have a temperature which is different from the first object temperature and from the second object temperature, e.g. a temperature equal to the support surface temperature.

In the embodiment of FIG. 5, optionally the thermal device 10 is configured to provide at least a part of the object W with a temperature gradient between a first maximum temperature and a first minimum temperature. The first object temperature is the first maximum temperature, the first minimum temperature or a temperature between the first maximum temperature and the first minimum temperature.

In the embodiment of FIG. 5, the thermal device 10 comprises a plurality of thermal elements 11. The thermal elements 11 may be heating elements and/or cooling elements. Optionally, the thermal device 10 contains both heating elements and cooling elements. The heating elements may for example be infrared LED's. The cooling elements may for example be Peltier elements.

In the embodiment of FIG. 5, the thermal device 10 is arranged at a distance from the object support WT, In an alternative embodiment, for example the thermal elements 11 may be arranged in or on the object support WT, e.g. between the burls WT-B. This is indicated by the dashed lines in FIG. 5.

In the embodiment of FIG. 5, the object positioner further comprises a control device 15. The control device 15 is configured to receive shape data relating to the shape of the object, and to generate a control signal based on this shape data. In this embodiment, the thermal device 10 is at least partly controlled on the basis of said control signal. In particular, the settings of the thermal elements 11 are controlled on the basis of the control signal, in order to make sure that the object W is provided with the correct first object temperature.

This shape data which is received by the control device 15 can for example be obtained by measuring or calculating the actual shape of the object W. This way, the deviation of the actual shape from the desired shape of the object W is known. This information is then used to the generate a control signal, on the basis of which the thermal device 10 is controlled.

Based on the shape data, it is determined (e.g. calculated) what the first object temperature should be. Then, a control signal is generated and sent to the thermal device 10 (e.g. through a wired data connection 16 or a wireless data connection; this data connection may be a direct connection or an indirect connection), and the thermal device 10 is activated to provide the object W with the first object temperature.

Optionally, also a desired temperature profile (either uniform or non-uniform) for the object W and/or a second object temperature is determined, and a corresponding control signal for the thermal device 10 is created by the control device 15.

In the embodiment of FIG. 5, the object positioner further comprises a measurement tool 20 which is configured to generate shape data of the object W. The control device 15 is configured to generate a control signal based on the shape data which is generated by the measurement tool 20. A wired data connection 21 or a wireless data connection is provided between the measurement tool to transfer the shape data as generated by the measurement tool 20 to the control device 15. This data connection may be a direct connection or an indirect connection.

The embodiment of FIG. 5 suitable for carrying out an embodiment of the method according to the invention.

In such an embodiment of the invention, the shape of the object W (e.g. a substrate, e.g. a wafer) is determined. In the embodiment of FIG. 5, the measurement tool 20 can for example be used for that. Alternatively or in addition, a different measurement tool (which is for example not connected to the control device 15 via data connection 21) can be used, or the shape of the object W can be calculated, e.g. using a mathematical model.

Then, the determined shape of the object W is compared with the desired or ideal shape of the object W, and therewith a difference between the desired shape and the determined shape is determined. This can for example be done in the control device 15, e.g. in a computer which forms part of the control device 15. Alternatively or in addition the can be (at least partly) done by using a computer which is not part of or connected to the control device 15.

Then, a temperature profile is determined for the object W which provides the object W with a deformed shape, wherein the difference between the deformed shape and the determined shape is smaller than the difference between the desired shape and the determined shape for at least a part of the object. Subsequently, the temperature profile is applied to the object W. When the embodiment of FIG. 5 is used to carry out this embodiment of the method according to the invention, the thermal device 10 with the thermal elements 11 is used to apply the temperature profile to the object W.

In the embodiment of FIG. 5, the object support WT is optionally provided with a clamping device to clamp the object onto the object support WT, in particular onto the object support surface WT-OSS of the object support WT. The clamping device is for example vacuum clamp device or an electrostatic clamp device.

In the variant of the embodiment of FIG. 5 in which a clamping device is provided, an embodiment of the method according to the invention can be carried out which further comprises the step of clamping the object W onto the object support WT, in particular onto an object support surface WT-OSS which is configured to engage at least a part of an object W during positioning of this object W. In this embodiment the temperature profile is applied either before or after effecting the clamping of the object W onto the object support WT.

For example, the object support WT is a substrate support, e.g. a wafer table, for example in a lithographic apparatus or object inspection apparatus. In a lithographic apparatus or an object inspection apparatus, the object W (e.g. a substrate, e.g. a wafer) is clamped onto the object support surface WT-OSS of the object support WT during the positioning of the object W, e.g. relative to a projection beam and/or a measurement beam. In accordance with this embodiment of the method according to the invention, the temperature profile is applied to the object W (e.g. the substrate, e.g. the wafer) either before or after the clamping of the object W on the object support surface WT-OSS is effected. In general, the temperature profile is applied before the exposure of the object W to the projection beam or measurement beam starts.

Optionally, in this embodiment, the object support surface WT-OSS has a support surface temperature, and the temperature profile which is applied to the object W is a uniform temperature profile at a first object temperature, which first object temperature differs from the support surface temperature by a first predetermined temperature difference.

Alternatively, in this embodiment the object support surface WT-OSS has a support surface temperature, and the temperature profile which is applied to the object W is a non-uniform temperature profile comprising a first object temperature, which first object temperature differs from the support surface temperature by a first predetermined temperature difference.

The temperature profile can be applied to the object W while the object W is arranged on the object support surface WT-OSS or prior to the arranging of the object W on the object support surface WT-OSS.

For example, the object support surface WT-OSS is formed by the surfaces at the free ends of a plurality of burls WT-B which are provided on the object support WT. One or more thermal elements 11 can for example be provided between the burls WT-B in order to apply the temperature profile to the object W. Alternatively or in addition, one or more thermal elements 11 may be provided at a distance from the object support.

Figure 6:
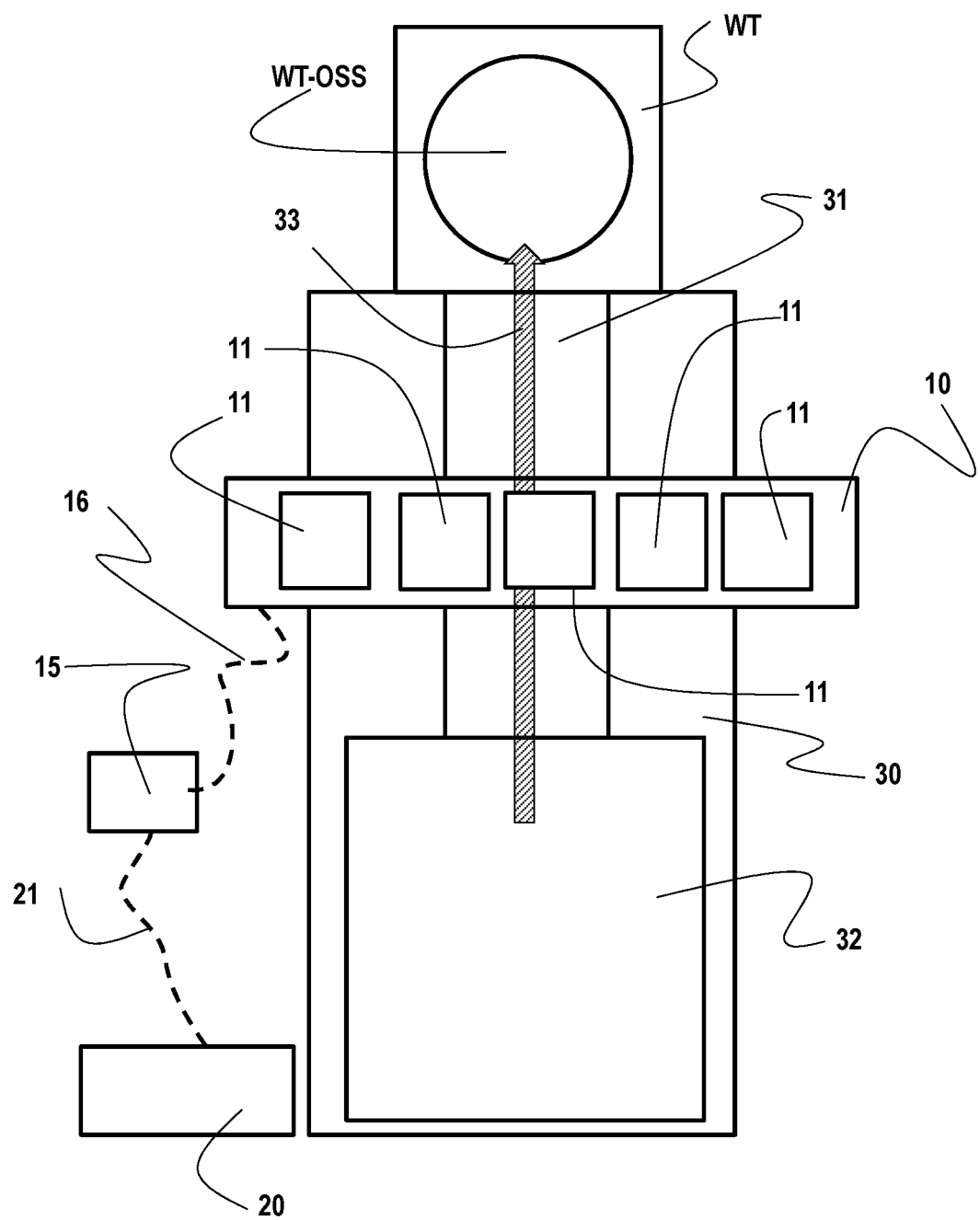

FIG. 6 shows a further embodiment of a object positioner according to the invention.

In the embodiment of FIG. 6, the object positioner comprises an object support WT having an object support surface WT-OSS. The object support surface WT-OSS is configured to engage at least a part of an object W, e.g. a substrate, e.g. a wafer. The object support surface WT-OSS has a support surface temperature. The object positioner further comprises a thermal device 10. The thermal device 10 is configured to provide at least a part of the object W with a first object temperature. The first object temperature differs from the support surface temperature by a first predetermined temperature difference.

In the embodiment of FIG. 6, the object positioner further comprises an object infeed device 30. The object infeed device 30 is configured to supply the object W to the object support WT, e.g. to the object support surface WT-OSS. In this embodiment, the thermal device 10 is arranged relative to the object infeed device 30 such that the object is provided with the first object temperature before the object W is arranged on the object support WT, e.g. on the object support surface WT-OSS of the object support WT. For example, the thermal device 10 may be at least partly be arranged inside or adjacent to the object infeed device 30.

The object infeed device 10 optionally comprises a thermal stabilization device 32. In the thermal stabilization device 32, the object W is generally brought to a desired uniform temperature which equals the support surface temperature. Optionally, at least a part of the thermal device 10, for example one or more thermal elements 11, may be arranged in the thermal stabilization unit 32. Such thermal elements 11 may provide the first object temperature to the first object either during or after the thermal stabilization by the thermal stabilization device 32.

In the embodiment of FIG. 6, the object positioner further comprises an object transport device 31 which is configured to transport an object from the thermal stabilization device 32 towards the object support WT along an object infeed path 33. At least a part of the thermal device 10 is arranged along the object infeed path 33. For example, one or more thermal elements 11 of the thermal device 10 are arranged along a object infeed path 31, for example such that the object W passes underneath the thermal elements 11 while being transported from the thermal stabilization device 31 towards the object support WT.

In this embodiment, any expected heating or cooling of the object during transport of the object W from the position of the thermal elements 11 to the object support WT is optionally taken into account when the first object temperature, and optionally also the second object temperature is determined.

In the embodiment of FIG. 6, at least a part of the object infeed device 30 and at least a part of the thermal device 10 are moveable relative to each other. For example, at least a part of the object infeed device 30 is moveable, for example an object transport device 31 which is moveable along the object infeed path 33, in order to transport the object W to the object support WT. At least a part of the thermal device 10, for example one or more thermal elements such as heating elements and/or cooling elements, may for example be arranged along the object infeed path 33, so the object W in the object infeed device 30 is provided with the first object temperature upon passing the thermal elements 11 of the thermal device 10. Alternatively or in addition, elements of object infeed device 30 may be stationary when the thermal device 10 provides the object with the first object temperature, e.g. by moving one or more thermal elements 11 over the object while the object is stationary in the object infeed device 30. Alternatively, both at least a part of the object infeed device 30 (e.g. the object transport device 31) and a part of the thermal device 10 (e.g. one or more thermal elements 11) move simultaneously, e.g. in opposite directions, so that a relative movement of the respective part of the object infeed device 30 and the respective part of the thermal device 10 is obtained.

For example, the thermal elements 11 may be heating elements (e.g. infrared LED's) and/or cooling elements (e.g. Peltier elements). These thermal elements 11 are optionally arranged in a grid-like layout (e.g. in a two dimensional Carthesian grid or in a polar grid) or in an array (e.g. in a linear arrangement). During heating and/or cooling of the object, the thermal elements 11 may be stationary relative to the object W, or the thermal elements 11 may be moved relative to the object W, e.g. in a scanning motion of the thermal elements 11 relative the object W. The thermal device 10 optionally comprises both heating elements as well as cooling elements.

Optionally, at least a part of the thermal device 10, e.g. one or more thermal elements 11, is/are mounted in or below an infeed device support surface of the object transport device 31, which infeed device support surface is configured to support the object W during the transport thereof to the object support WT. Optionally, the thermal device comprises multiple thermal elements 11, which are arranged in or below the infeed device support surface. Optionally, the object transport device 31 comprises a plurality of burls, and the surfaces at the free ends of these burls together form the infeed device support surface. The thermal elements 11 of the thermal device may in that case for example be arranged between those burls.

Figure 7:
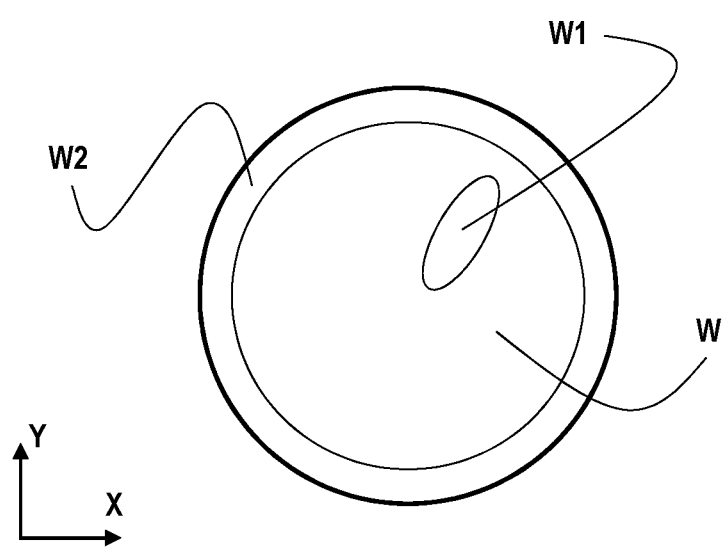

FIG. 7 schematically shows an example of an object W with a non-uniform temperature distribution as can be applied by a thermal device 10.

The object W comprises a first portion W1 which is provided with a first object temperature, and a second portion W2 which is provided with a second object temperature. For the remainder of the object, the temperature is controlled such that it is as close as possible to the support surface temperature. The first portion W1 is for example an area which before applying the first object temperature comprised a local bulge. The second portion W2 is an annular area adjacent to the edge of the object W. In the second portion W2 for example a deformation was present which before applying the second object temperature caused the object W to have an undesired bowl-shape or umbrella-shape.

Embodiments are provided according to the following clauses:

1. Object positioner which comprises:
    an object support having an object support surface which is configured to engage at least a part of an object, said object support surface having a support surface temperature, and
    a thermal device, which thermal device is configured to provide at least a part of the object with a first object temperature, which first object temperature differs from the support surface temperature by a first predetermined temperature difference.
2. Object positioner according to clause 1, wherein the thermal device is configured to provide a first portion of the object with the first object temperature and a second portion of the object with a second object temperature, which second object temperature differs from the support surface temperature by a second predetermined temperature difference.
3. Object positioner according to any of the preceding clauses, wherein the thermal device is configured to provide at least a part of the object with a temperature gradient between a first maximum temperature and a first minimum temperature, wherein the first object temperature is the first maximum temperature, the first minimum temperature or a temperature between the first maximum temperature and the first minimum temperature.
4. Object positioner according to any of the preceding clauses, wherein the object positioner further comprises an object infeed device which is configured to supply the object to the object support, and wherein the thermal device is arranged relative to the object infeed device such that the object is provided with the first object temperature before the object is arranged on the object support.
5. Object positioner according to clause 4, wherein at least a part of the object infeed device and at least a part of the thermal device are moveable relative to each other.
6. Object positioner according to any of the preceding clauses, wherein at least a part of the thermal device and at least a part of the object support are moveable relative to each other.
7. Object positioner according to clause 4, wherein at least a part of the thermal device is mounted in the object infeed device.
8. Object positioner according to any of the preceding clauses, wherein the thermal device is mounted in the object support, adjacent to the object support surface.
9. Object positioner according to any of preceding clauses, wherein the thermal device comprises a heating element which is for example an infrared LED and/or cooling element which is for example a Peltier element.
10. Object positioner according to any of the preceding clauses, wherein the object positioner further comprises a control device, which control device is configured to receive shape data relating to the shape of the object, and to generate a control signal based on the shape data, and wherein the thermal device is at least partly controlled on the basis of said control signal.

11. Object positioner according to any of the preceding clauses, which object positioner further comprises a measurement tool which is configured to generate shape data of an object.
12. Object positioner according to clause 10, which object positioner further comprises a measurement tool which is configured to generate shape data of an object, and wherein the control device is configured to generate a control signal based on the shape data which is generated by the measurement tool.
13. Object positioner according to any of the preceding clauses, wherein the object support surface is configured to engage at least a part of an object which object is a substrate, e.g. a wafer.
14. Method for correcting the shape of an object, which method comprises the following steps:
    determining the shape of said object,
    comparing the determined shape of said object with a desired shape of said object, and therewith determining a difference between the desired shape and the determined shape,
    determining a temperature profile for the object which provides the object with a deformed shape, wherein the difference between the deformed shape and the determined shape is smaller than the difference between the desired shape and the determined shape for at least a part of the object, and
    applying the temperature profile to the object.
15. Method according to clause 14, wherein the method further comprises the step of clamping the object onto an object support having an object support surface which is configured to engage at least a part of an object during positioning of said object, and wherein the temperature profile is applied either before or after effecting the clamping of the object onto the object support.
16. Method according to clause 15, wherein the object support surface has a support surface temperature, and wherein the temperature profile which is applied to the object is a uniform temperature profile at a first object temperature, which first object temperature differs from the support surface temperature by a first predetermined temperature difference.
17. Method according to clause 15, wherein the object support surface has a support surface temperature, and wherein the temperature profile which is applied to the object is a non-uniform temperature profile comprising a first object temperature, which first object temperature differs from the support surface temperature by a first predetermined temperature difference.
18. Method according to any of the clauses 14-17, wherein the object is a substrate, e.g. a wafer.
19. Lithographic apparatus, which lithographic apparatus comprises an object positioner according to any of the clauses 1-13.
20. Lithographic apparatus according to clause 19, which lithographic apparatus further comprises a projection system, and wherein the object support is configured for positioning an object relative to the projection system.
21. Lithographic apparatus, comprising:
    an illumination system configured to condition a radiation beam;
    a support constructed to support a patterning device, the patterning device being capable of imparting the radiation beam with a pattern in its cross-section to form a patterned radiation beam;
    a projection system configured to project a patterned radiation beam onto a substrate; the projection system comprising a plurality of optical elements,
    a wafer stage having a substrate support surface which is configured to engage at least a part of the substrate, said substrate support surface having a support surface temperature, and
    a thermal device, which thermal device is configured to provide at least a part of the substrate with a first object temperature, which first object temperature differs from the support surface temperature by a first predetermined temperature difference.
22. Lithographic apparatus according to clause 21, wherein the lithographic apparatus further comprises a thermal stabilization device, and wherein at least a part of the thermal device is arranged in the thermal stabilization device.
23. Lithographic apparatus according to clause 21, wherein the lithographic apparatus further comprises a thermal stabilization device and a substrate transport device which is configured to transport a substrate from the thermal stabilization device towards the wafer stage along a substrate infeed path, and wherein at least a part of the thermal device is arranged along the substrate infeed path.
24. Object inspection apparatus, which object inspection apparatus comprises an object positioner according to any of the clauses 1-13.
25. A device manufacturing method comprising transferring a pattern from a patterning device onto a substrate, comprising the step of using a lithographic apparatus according to any of clauses 19-23.
26. A device manufacturing method, which comprises the following steps:
    determining the shape of a substrate,
    comparing the determined shape of said substrate with a desired shape of said substrate, and therewith determining a difference between the desired shape and the determined shape,
    determining a temperature profile for the substrate which provides the substrate with a deformed shape, wherein the difference between the deformed shape and the determined shape is smaller than the difference between the desired shape and the determined shape for at least a part of the substrate,
    applying the temperature profile to the substrate, and
    after applying the temperature profile to the substrate, transferring a pattern from a patterning device onto the substrate.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An object positioner comprising:
   an object support having an object support surface configured to engage at least a part of an object, and
   a thermal device configured to change a shape of at least a portion of the object by provision of the at least portion of the object with a first object temperature, which first object temperature differs from a support surface temperature of the object support surface by a first predetermined temperature difference and wherein the shape is of a cross-section of the object in a direction non-parallel to a main surface of the object.

2. The object positioner according to claim 1, wherein the thermal device is configured to provide a first portion of the object with the first object temperature and a second portion of the object with a second object temperature, which second object temperature differs from the support surface temperature by a second predetermined temperature difference.

3. The object positioner according to claim 1, wherein the thermal device is configured to provide at least a part of the object with a temperature gradient between a first maximum temperature and a first minimum temperature, wherein the first object temperature is the first maximum temperature, the first minimum temperature or a temperature between the first maximum temperature and the first minimum temperature.

4. The object positioner according to claim 1, further comprising an object infeed device configured to supply the object to the object support, and wherein the thermal device is arranged relative to the object infeed device such that the object is provided with the first object temperature before the object is arranged on the object support.

5. The object positioner according to claim 4, wherein at least a part of the object infeed device and at least a part of the thermal device are moveable relative to each other.

6. The object positioner according to claim 1, wherein at least a part of the thermal device and at least a part of the object support are moveable relative to each other.

7. The object positioner according to claim 4, wherein at least a part of the thermal device is mounted in the object infeed device.

8. The object positioner according to claim 1, wherein the thermal device is mounted in the object support, adjacent to the object support surface.

9. The object positioner according to claim 1, wherein the thermal device comprises a heating element.

10. The object positioner according to claim 1, further comprising a control device configured to receive shape data relating to a shape of the object, and to generate a control signal based on the shape data, and wherein the thermal device is at least partly controlled on the basis of the control signal.

11. The object positioner according to claim 1, further comprising a measurement tool configured to generate shape data of an object.

12. The object positioner according to claim 10, further comprising a measurement tool configured to generate shape data of an object, and wherein the control device is configured to generate a control signal based on the shape data which is generated by the measurement tool.

13. The object positioner according to claim 1, wherein the object is a substrate.

14. A method for correcting the shape of an object, the method comprising:
   determining a shape of the object, the shape being of a cross-section of the object in a direction non-parallel to a main surface of the object,
   comparing the determined shape of the object with a desired shape of the object, and determining a difference between the desired shape and the determined shape,
   determining a temperature profile for the object which provides the object with a deformed shape, wherein the difference between the deformed shape and the desired shape is smaller than the difference between the desired shape and the determined shape for at least a part of the object, and
   applying the temperature profile to the object.

15. The method according to claim 14, further comprising clamping the object onto an object support having an object support surface which is configured to engage at least a part of an object during positioning of the object, and wherein the temperature profile is applied either before or after effecting the clamping of the object onto the object support.

16. The method according to claim 15, wherein the object support surface has a support surface temperature, and wherein the temperature profile which is applied to the object is a uniform temperature profile at an object temperature, which object temperature differs from the support surface temperature by a predetermined temperature difference.

17. The method according to claim 15, wherein the object support surface has a support surface temperature, and wherein the temperature profile which is applied to the object is a non-uniform temperature profile comprising an object temperature, which object temperature differs from the support surface temperature by a predetermined temperature difference.

18. The method according to claim 14, wherein the object is a substrate.

19. A lithographic apparatus comprising the object positioner according to claim 1.

20. A lithographic apparatus, comprising:
- a support constructed to support a patterning device, the patterning device being capable of imparting a radiation beam with a pattern in its cross-section to form a patterned radiation beam;
- a projection system configured to project the patterned radiation beam onto a substrate;
- a wafer stage having a substrate support surface configured to engage at least a part of the substrate, the substrate support surface having a support surface temperature; and
- a thermal device configured to change a shape of at least a portion of the object by provision of the at least portion of the substrate with a substrate temperature, which substrate temperature differs from a support surface temperature of the object support surface by a predetermined temperature difference and wherein the shape is of a cross-section of the object in a direction non-parallel to a main surface of the object.

\* \* \* \* \*